(12) United States Patent
Hsu

(10) Patent No.: US 7,754,623 B2
(45) Date of Patent: Jul. 13, 2010

(54) APPARATUS FOR FORMING FILM HOLE

(75) Inventor: Chia-Shuo Hsu, Tayuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 0 days.

(21) Appl. No.: 11/309,294

(22) Filed: Jul. 21, 2006

(65) Prior Publication Data

US 2007/0075386 A1    Apr. 5, 2007

(30) Foreign Application Priority Data

Sep. 16, 2005    (CN) .................. 2005 1 0037363

(51) Int. Cl.
*H01L 21/00* (2006.01)
*H01L 21/306* (2006.01)
*B08B 3/04* (2006.01)
*C23F 1/00* (2006.01)

(52) U.S. Cl. .................. 438/800; 134/131; 156/345.11

(58) Field of Classification Search ................. 438/800; 156/345.11; 134/124, 129, 131
See application file for complete search history.

(56) References Cited

U.S. PATENT DOCUMENTS

| | | | | | |
|---|---|---|---|---|---|
| 3,679,500 | A | * | 7/1972 | Kubo et al. ................... | 216/56 |
| 4,069,085 | A | * | 1/1978 | Buysman et al. ....... | 156/345.19 |
| 4,500,622 | A | * | 2/1985 | Horie et al. .................... | 430/78 |
| 4,772,349 | A | * | 9/1988 | Cooper .................. | 156/345.15 |
| 5,236,746 | A | * | 8/1993 | Kapp-Schwoerer et al. . | 427/508 |
| 6,561,937 | B1 | * | 5/2003 | Wegele ........................ | 474/263 |
| 2002/0117382 | A1 | * | 8/2002 | Maine, Jr. .................... | 198/853 |
| 2002/0119716 | A1 | * | 8/2002 | Santhosh ........................ | 442/1 |
| 2003/0161129 | A1 | | 8/2003 | Kusano et al. | |

\* cited by examiner

*Primary Examiner*—Lex Malsawma
(74) *Attorney, Agent, or Firm*—Jeffrey T. Knapp

(57) ABSTRACT

An exemplary film hole forming apparatus (400) includes a chemical etching system (410) and a driving system (420). The driving system includes a transmission belt, which passes through the chemical etching system. A material of the transmission belt is polytetrafluoroethylene, polytetrafluoroethylene-containing material, polyvinylidene fluoride, metal, or metal-sandwiched composite. An exemplary method for forming film holes includes the following steps: providing a flexible printed circuit board (300) to be etched, with copper holes (321) pre-formed thereat and the copper holes exposing a base film (310) at corresponding positions; and transporting the flexible printed circuit board into a chemical etching system by a transmission belt to form film holes in the base film.

4 Claims, 12 Drawing Sheets

APPARATUS FOR FORMING FILM HOLE

TECHNICAL FIELD

The present invention relates to methods and apparatus for manufacturing flexible printed circuit boards and, more particularly, to apparatus and methods for manufacturing film holes for flexible printed circuit boards.

BACKGROUND

With the development of science and technology, mobile phones, portable computer and electronic products used in cars have increasingly high requirements for miniaturization and lightness. To meet these requirements flexible printed circuit boards are replacing conventional printed circuit boards due to their thinness, toughness, flexibility and foldability, and have become more and more widely used in all kinds of electronic products.

Conventional flexible printed circuit boards comprise base films, conductive patterns disposed on two opposite surfaces of the base films and via holes for conducting at least two conductive patterns of the flexible printed circuit board. The conductive patterns are made from metal such as gold (Au) or copper (Cu) etc, and serve to conduct current through the via holes in the flexible printed boards. The via holes are comprised of copper holes in the copper film, and film holes in the base film. In this particular invention via holes are referred to as film holes.

The base film is generally made from polyimide (PI) or polyethylene terephthalate (PET). Polyimide materials are flame-resistant, stable in physical dimension, with high tensile strength and thermostability. PET has properties similar to PI but have lower dielectric constant and cannot withstand high temperatures.

Conventionally, film holes are formed by a laser-ablation process using a laser irradiation apparatus. FIG. 9 shows a schematic view of a laser irradiation apparatus with a single irradiation hole. The laser irradiation apparatus 100 comprises a laser system 110 and a driving system 120 disposed adjacent to the laser system 110. The driving system 120 comprises a wrap reel 121 and a corresponding take-up reel 122. A base film 123 is wrapped around the wrap reel 121. During operation the base film 123 is taken up by the take-up reel 122 thereby moving the base film 123 between the wrap reel 121 and the take-up reel 122. The base film 123 is made of either polyimide or polyethylene terephthalates. Referring to FIG. 10, a plurality of sprocket holes 1231 are disposed along lateral sides of the base film 123 so as to help the movement of the base film 123 between the wrap reel 121 and the take-up reel 122. In this way, film holes can be formed in the base film 123 continuously. Referring to FIG. 11, a plurality of film holes 1232 are formed therein.

The above laser irradiation apparatus 100 involves only a single irradiation process, thereby each desired film hole 1232 will require a positioning step, which is both time-consuming and un-conducive to mass production.

Referring to FIG. 12, another laser irradiation apparatus 200 with multiple irradiation holes is shown. The laser irradiation apparatus 200 is similar to the laser irradiation apparatus 100 in FIG. 9, but with an additional photo mask 201. The photo mask 201 has holes corresponding to the desired pattern defined in it, thus enabling a desired pattern to be created when forming the film holes. Therefore, one laser flash produced by the laser irradiation apparatus 200 can form multiple film holes in the base film 223.

However, residue tends to remain in the film holes after laser ablation and can be difficult to remove. In addition, during laser ablation ashes may also be created, these may then escape outwards in all directions and can reach a height of about 1 centimeter. Ashes may also reach the photo mask 201 above the base film 123 and bring residual heat thereto. The photo mask 201 may therefore suffer from shape distortion, which will effect precision and lead to a decrease in quality of production. Furthermore, it is difficult when using the laser ablation method to precisely control depth of the film holes. Moreover, since with a single focus only a single or particular number of film holes can be obtained, production efficiency is relatively low, and is therefore still not favorable for mass production.

Therefore, a heretofore unaddressed need exists in the industry to address the aforementioned deficiencies and inadequacies.

SUMMARY

In a first preferred embodiment, a film hole forming apparatus comprises a chemical etching system and a driving system, and the driving system comprises a transmission belt. The transmission belt passes through the chemical etching system. A material of the transmission belt is polytetrafluoroethylene, polytetrafluoroethylene-containing material, polyvinylidene fluoride, metal, or metal-sandwiched composite.

In a second preferred embodiment, a method for forming film holes comprises the following steps: providing a flexible printed circuit board to be etched, with copper holes preformed therein and the copper holes making a base film of the flexible printed circuit board at corresponding positions uncovered; and transporting the flexible printed circuit board into a chemical etching system using a transmission belt, thereby forming film holes in corresponding positions of the base film. The transmission belt is made of polytetrafluoroethylene, polytetrafluoroethylene-containing material, polyvinylidene fluoride, metal, or metal-sandwiched composite.

BRIEF DESCRIPTION OF THE DRAWINGS

Many aspects of the film hole forming apparatus and methods for forming film holes can be better understood with reference to the following drawings. The components in the drawings are not necessarily drawn to scale, emphasis instead being placed upon clearly illustrating the principles of the present lighting components. Moreover, in the drawings, like reference numerals designate corresponding parts throughout the several views.

DETAILED DESCRIPTION OF THE PREFERRED EMBODIMENTS

Figure 1:
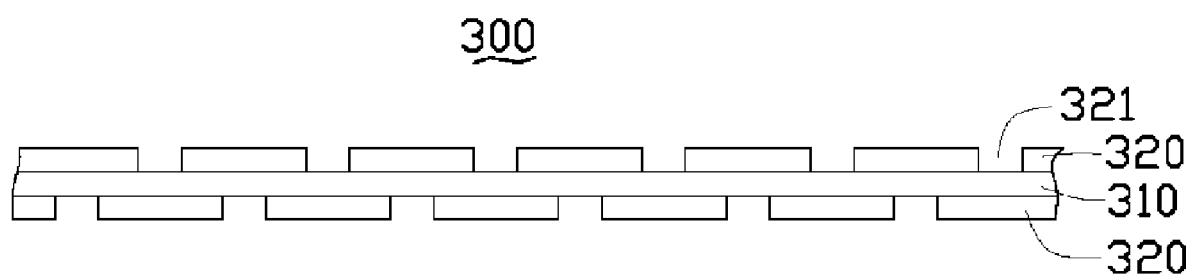
FIG. 1 is a schematic view of a first flexible printed circuit boards to be etched.

Referring to FIG. 1, a first flexible printed circuit board 300 to be etched comprises a base film 310 and copper films 320 disposed on two opposite surfaces of the base film 310. The base film 310 is made from polyimide or polyethylene terephthalate. Copper holes 321 are formed in the copper films 320. Therefore, portions of the base film 310 are uncovered at places corresponding to the copper holes 321. In other words, portions of the base film 310 are exposed at the copper holes 321. The copper holes 321 function to define the film holes to be formed.

The copper holes 321 are pre-formed using a lithography process followed by a chemical etching process. The lithography process comprises the following steps: first of all, cleaning the surface of the copper film 320; secondly, gelatinizing a photoresist layer on surfaces of the copper film 320, the photoresist layer being poly-methyl methacrylate (PMMA); thirdly, exposing to radiation to replicate the pattern of a patterned photo mask onto the photoresist layer; fourthly, developing to remove the exposed portions of the photoresist layer to form patterns needed, thereby making copper films partially uncovered by the photo resist; fifthly, etching the uncovered copper films with a copper etchant to form the copper holes 321; finally, removing the residual photoresist to form the flexible printed circuit boards 300 of FIG. 1.

Figure 2:
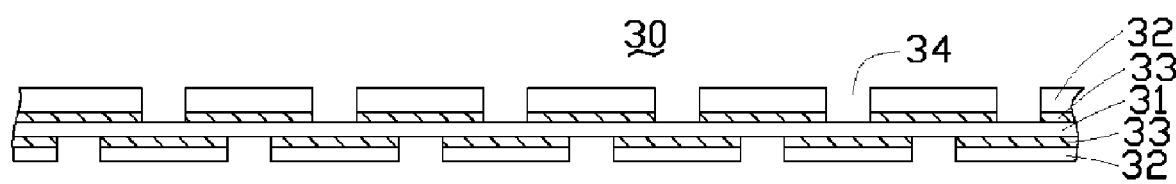
FIG. 2 is a schematic view of a second flexible printed circuit boards to be etched.

Referring to FIG. 2, a second flexible printed circuit board 30 is formed by sputtering copper films 32 onto surfaces of a base film 31. In production, thin nichrome alloy layers 33 are pre-formed on the surfaces of the base film 31, which charges the surfaces of the base film 31 before sputtering. Therefore, the flexible printed circuit board 30 comprises a base film 31, nichrome alloy layers 33 disposed on two opposite surfaces of the base film 31, and copper films 32 disposed on the nichrome alloy layers 33. Similar to the flexible printed circuit board 300 in FIG. 1, copper holes 34 are formed in the copper films 32 by the same process as described above. Furthermore, since nichrome is a metallic material whose reactivity is higher than copper, copper etchants can also etch nichrome in positions corresponding to the copper holes 34. Therefore, portions of the nichrome alloy layers 33 corresponding to the copper holes 34 are also etched. In other words, the nichrome alloy layers 33 have nichrome holes formed therein. The nichrome holes are respectively in communication with the copper holes 34. Specifically, the nichrome holes formed in one nichrome alloy layer 33 are respectively in communication with the copper holes 34 in the corresponding copper film 32 formed on the one nichrome alloy layer 33. In this way, portions of the base film 31 are uncovered. In other words, portions of the base film 31 are exposed at the nichrome holes and the copper holes 34. Those uncovered portions corresponding to the copper holes 34 of the base film 31 are also places in which film holes are to be formed.

A first, a second and a third preferred embodiments described below are film hole forming apparatuses corresponding to the first flexible printed circuit board 300 in FIG. 1.

Figure 3:
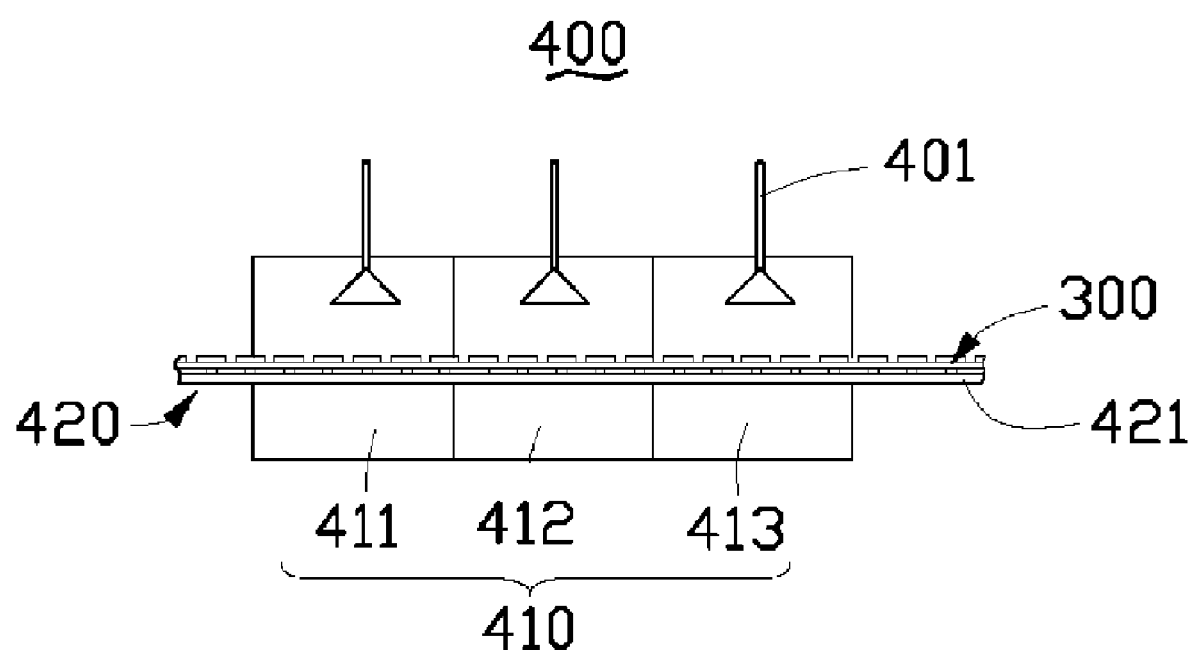
FIG. 3 is a schematic view of a film hole forming apparatus of a first preferred embodiment.

Referring to FIG. 3, a film hole forming apparatus 400 of a first preferred embodiment comprises a chemical etching system 410 and a driving system 420. The driving system 420 comprises a transmission belt 421, at least one wrap reel (not shown), and a corresponding take-up reel (not shown). The transmission belt 421 is wrapped between the wrap reel and the take-up reel. The transmission belt 421 is used to transport a plurality of the flexible printed circuit boards 300 through the chemical etching system 410. A material of the transmission belt 421 is Teflon®, Teflon®-containing material, poly (vinylidene finoride) polyvinylidene fluoride, metal, or metal-sandwiched composite etc. Teflon® is actually polytetrafluoroethylene (PTFE), which is a thermostable, non-cohesive, wear resistant, moisture resistant and highly insulating material. The polytetrafluoroethylene-containing material can be a mixture of polytetrafluoroethylene and glass fiber, or a mixture of polytetrafluoroethylene and polymer, such as polyimide, poly-methyl methacrylate or polycarbonate etc. The metal-sandwiched composite has a structure as follows: a polymer material sandwiched between two metal materials, wherein the metal materials make sure the transmission belt is not affected during etching, and the polymer material provides flexibility to the transmission belt.

The chemical etching system 410 comprises an activating bath 411, a plurality of etching baths 412 a plurality of water-washing baths 413 arranged in that sequence. A spray thrower 401 is disposed above each bath 411, 412, 413, and is used to spray a certain liquid. The spray thrower 401 above the activating bath 411 can spray activating agent to clean the surfaces of each flexible printed circuit board 300. The activating agent can be de-ionized water. The spray thrower 401 above the chemical etching baths 412 can spray chemical etching solution, such as ethanolamine alkaline solution. The spray thrower 401 above the water-washing baths 413 can spray water, either hot water or that at room temperature.

When the flexible printed circuit board 300 on the transmission belt 421 passes through the activating bath 411, activating agent is sprayed onto the flexible printed circuit board 300, thus cleaning surfaces of the flexible printed circuit board 300. When the flexible printed circuit board 300 on the transmission belt 421 passes through the chemical etching bath 412, chemical etching solution is sprayed onto the flexible printed circuit board 300. Since the chemical etching solution can only etch film materials and cannot etch metal materials, it cannot affect the portions of the base film 310 covered by the copper films 320, and can only etch the uncovered portions of the base film 310. Accordingly, the uncovered portions of the base film 310 become thoroughly etched, thus forming film holes. When the flexible printed circuit board 300 on the transmission belt 421 passes through the water-washing bath 412, it is washed by the water sprayed thereonto and is thus neutralized.

After the flexible printed circuit board 300 passes out of the chemical etching system 410, it may be passed through a drying system (not shown), which comprises an air-drying portion and a baking portion. Dried flexible printed circuit boards 300 with formed film holes are thus obtained.

In the film hole forming apparatus 400, when the flexible printed circuit boards 300 are to have film holes formed on both surfaces, either of the following two methods can be used. One method is to dip the flexible printed circuit boards 300 into the chemical etching solution by slowly moving the flexible printed circuit boards 300 through the chemical etching solution. Thus both surfaces can be etched by the one process. The other method is to etch the surfaces one by one.

Figure 4:
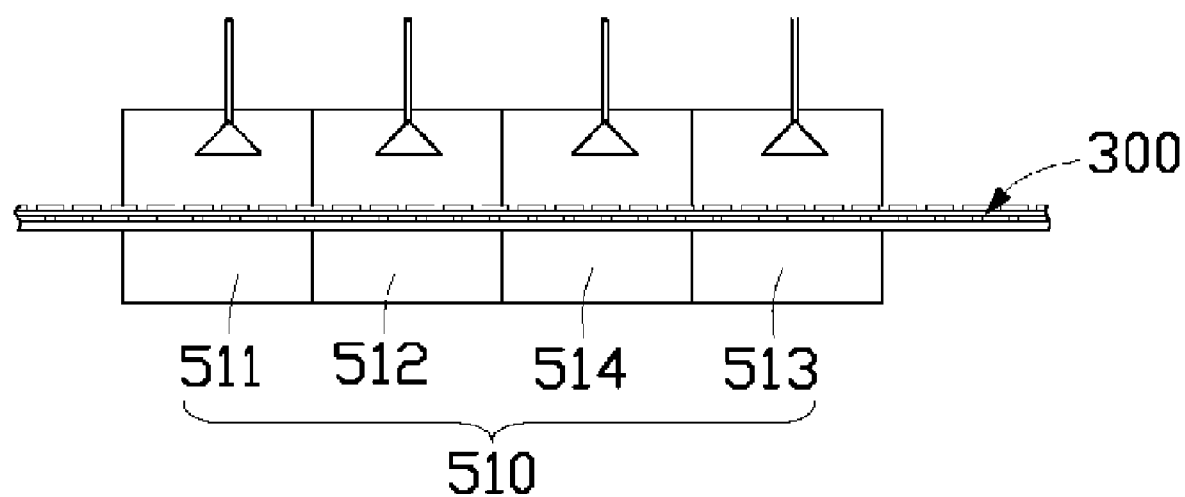
FIG. 4 is a schematic view of a film hole forming apparatus of a second preferred embodiment.

Referring to FIG. 4, a film hole forming apparatus of a second preferred embodiment is similar to that of the first preferred embodiment, except for its chemical etching system. The chemical etching system 510 of the second preferred embodiment comprises an activating bath 511, a plurality of chemical etching baths 512 and a plurality of water-washing baths 513, and further comprises an acid-washing bath 514 between the chemical etching baths 512 and the water-washing baths 513. The acid-washing bath 514 functions to neutralize the alkaline of the chemical etching baths 512 remaining on the flexible printed circuit board 300.

Figure 5:
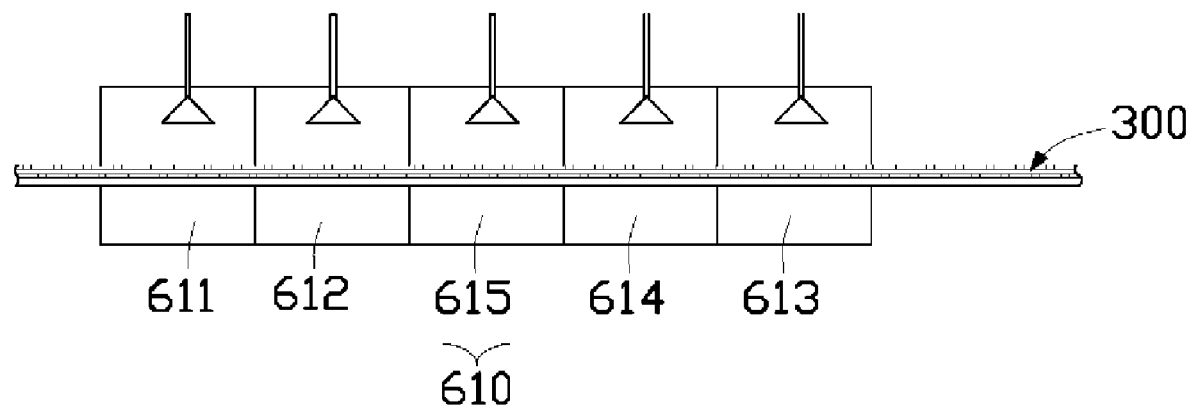
FIG. 5 is a schematic view of a film hole forming apparatus of a third preferred embodiment.

A film hole forming apparatus of a third preferred embodiment is similar to that of the second preferred embodiment, except for its chemical etching system. Referring to FIG. 5, as well as comprising an activating bath 611, a plurality of chemical etching baths 612, an acid-washing bath 614 and a plurality of water-washing baths 613, the chemical etching system 610 of the third preferred embodiment further comprises a plurality of pre-washing baths 615 between the chemical etching baths 612 and the acid-washing bath 614. The pre-washing baths 615 can wash the flexible printed circuit boards 300 as they come out from the chemical etching baths 612.

The flexible printed circuit boards 30 have the extra nichrome alloy layers 33, and one of these nichrome alloy layers 33 should also be etched. The particular nichrome alloy layer 33 cannot be etched by the chemical etching solution as described in relation to FIGS. 3-5, because that chemical etching solution can only etch the base film 31 and cannot affect metal materials. When the flexible printed circuit boards 30 are made up of multiple layers of base films 31, the nichrome alloy layers 33 disposed therein will affect the electrical conductivity thereof.

Figure 6:
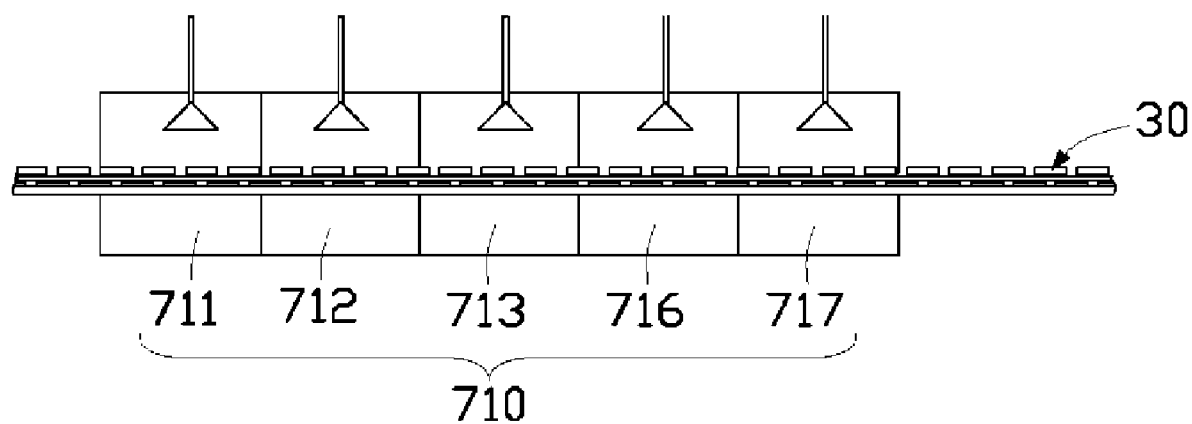
FIG. 6 is a schematic view of a film hole forming apparatus of a fourth preferred embodiment.

Referring to FIG. 6, a film hole forming apparatus of a fourth preferred embodiment is similar to that of the first preferred embodiment, except for its chemical etching system. The chemical etching system 710 of the fourth preferred embodiment comprises an activating bath 711, a plurality of chemical etching baths 712 and a plurality of water-washing baths 713, and further comprises a slight-etching bath 716 and a plurality of end-washing baths 717 disposed after the water-washing baths 713 in that sequence. In other words, the activating bath 711, the chemical etching baths 712, the water-washing baths 713, the slight-etching bath 716, and the end-washing baths 717 are arranged in that sequence. In the slight-etching bath 716, nichrome etchants are sprayed onto the flexible printed circuit boards 30 so as to remove portions of the nichrome alloy layers 33 facing the copper holes 34 (see also FIG. 2). That is, portions of the nichrome alloy layers 33 adjacent to and corresponding to the exposed portions of the base film 31 are etched. A temperature of the nichrome etchants sprayed on the flexible printed circuit boards 30 can be in a range from 10 to 50 degrees Centigrade, and more preferably can be about 30 degrees Centigrade. The flexible printed circuit boards 30 passing out from the slight-etching bath 716 are then washed in the end-washing baths 717 which spray water.

Figure 7:
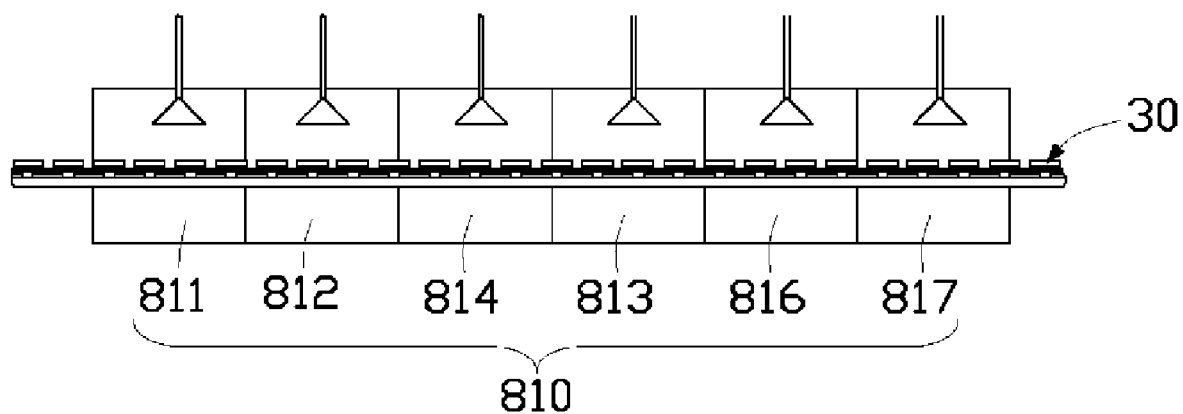
FIG. 7 is a schematic view of a film hole forming apparatus of a fifth preferred embodiment.

Referring to FIG. 7, a film hole forming apparatus of a fifth preferred embodiment is similar to that of the second preferred embodiment, except for its chemical etching system. The chemical etching system 810 of the fifth preferred embodiment comprises an activating bath 811, a plurality of chemical etching baths 812, an acid-washing bath 814 and a plurality of water-washing baths 813, and further comprises a slight-etching bath 816 and a plurality of end-washing baths 817 disposed after the water-washing baths 813 in that sequence. The slight-etching bath 816 and the end-washing baths 817 are similar in function to the slight-etching bath 716 and the end-washing baths 717 of the fourth preferred embodiment.

Figure 8:
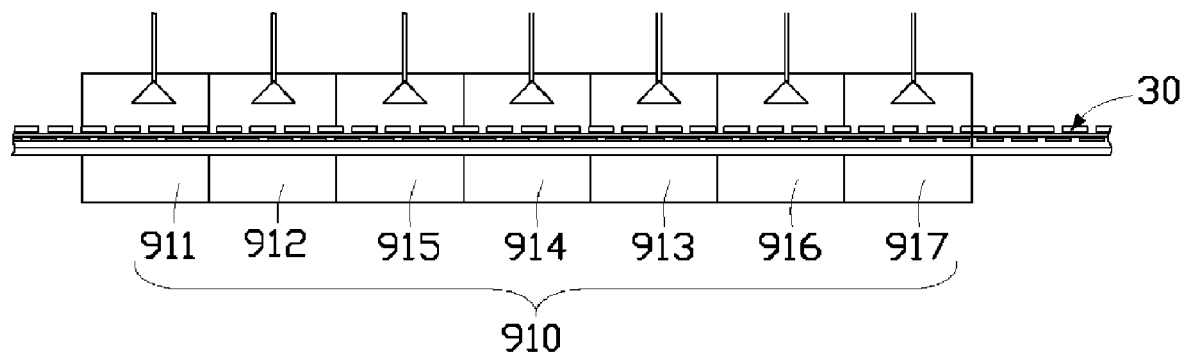
FIG. 8 is a schematic view of a film hole forming apparatus of a sixth preferred embodiment.
Figure 9:
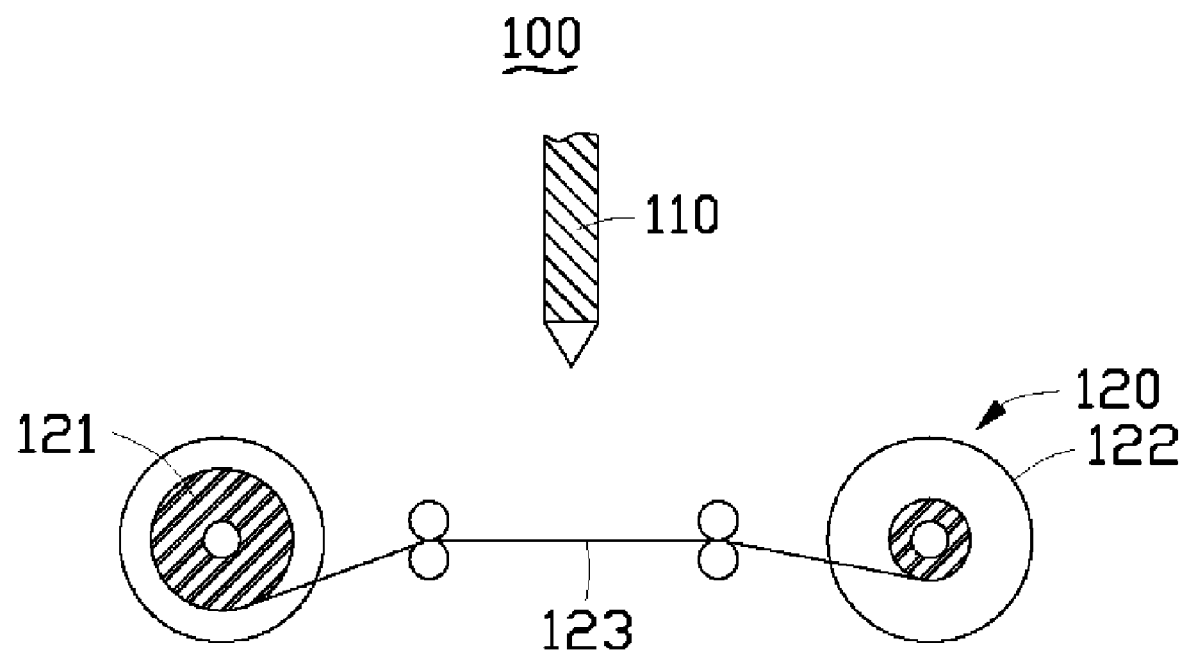
FIG. 9 is a schematic view of a conventional laser ablation apparatus with single irradiation hole.
Figure 10:
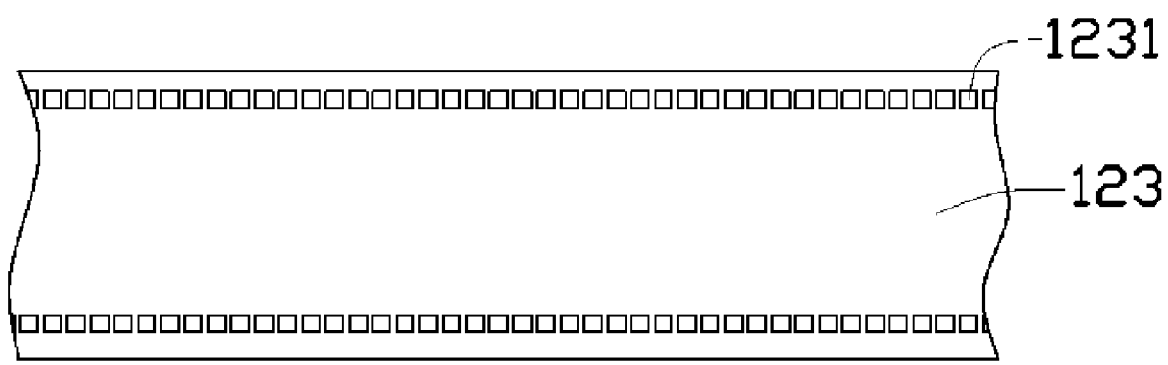
FIG. 10 is a plan of a base film pre-ablated.
Figure 11:
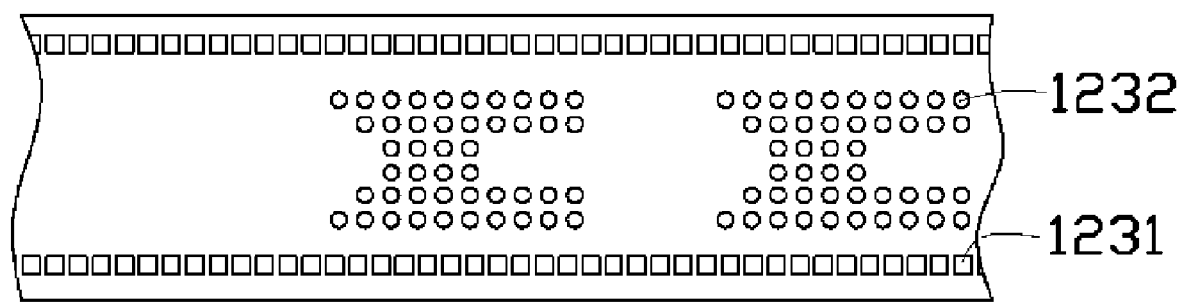
FIG. 11 is a plan of a the base film after ablated.
Figure 12:
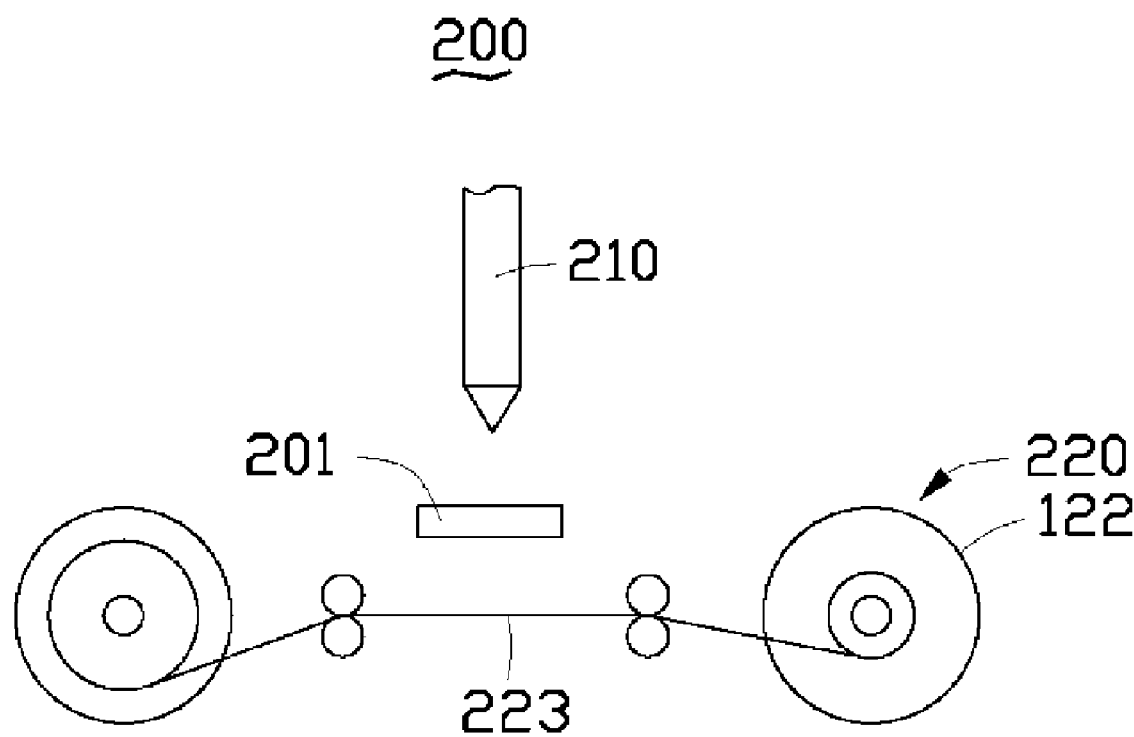
FIG. 12 is a schematic view of a conventional laser ablation apparatus with multiple irradiation holes.

Referring to FIG. 8, a film hole forming apparatus of a sixth preferred embodiment is similar to that of the third preferred embodiment, except for its chemical etching system. The chemical etching system 910 of the sixth preferred embodiment comprises an activating bath 911, a plurality of chemical etching baths 912, a plurality of pre-washing baths 915, an acid washing bath 914 and a plurality of water-washing baths 913, and further comprises a slight-etching bath 916 and a plurality of end-washing baths 917 disposed after the water-washing baths 913. The slight-etching bath 916 and the end-washing baths 917 are similar in function to the slight-etching bath 716 and the end-washing baths 717 of the fourth preferred embodiment.

A method for forming film holes comprises the following steps: first of all, providing a flexible printed circuit board which comprises a base film and at least one metal film (e.g., a copper film) on one surface of the base film, the at least one metal film defining a plurality of spaced holes (e.g., copper holes) to expose portions of the base film (e.g., the copper holes may expose portions of both surfaces of the base film); then uncovering the base film of the flexible printed circuit board corresponding to the copper holes; and transporting the flexible printed circuit boards into a chemical etching system of the film hole forming apparatus described hereinabove, by a transmission belt thereof. Thereby, forming film holes in the uncovered base film are formed.

Compared to the laser ablation apparatus and method, the film hole forming apparatus and method of the present invention use a chemical etching process which has the following advantages. First of all, this process does not require precision positioning of the base film, because the previously formed copper holes give precise location to the film holes to be formed. Therefore, precision and quality can be improved. Secondly, chemical etching processes can handle large numbers of flexible printed circuit boards at once; and the transmission belt made of polytetrafluoroethylene or the like will not be etched by the etchants therein, and is therefore favorable for continuous production. Finally, etchants of different baths can only etch particular material. For example, ethanolamine alkaline solution can only etch the base film, and cannot affect metal materials. Therefore, the depth of the film holes can be determined by the thickness of the base film. That is, the depth of the film holes can be easily controlled.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A film hole forming apparatus for forming holes in a printed circuit board, the printed circuit board comprising a base film, two nichrome alloy layers formed on two opposite surfaces of the base film, and two copper films formed on the nichrome alloy layers, respectively, the copper films having copper holes formed therein, the nichrome alloy layers having nichrome holes formed therein, the nichrome holes being respectively in communication with the copper holes to expose portions of the base film, the film hole forming apparatus comprising:

a chemical etching system comprising an activating bath, a chemical etching bath, a water-washing bath, a slight-etching bath, and an end-washing bath in that sequence, the activating bath being configured for cleaning the printed circuit board, the chemical etching bath being configured for etching portions of the base film exposed at the nichrome holes and the copper holes, the water-washing bath being configured for washing the printed circuit board, the slight-etching bath being configured for removing portions of the nichrome alloy layers corresponding to the exposed portions of the base film, and the end-washing baths being configured for washing the printed circuit board; and a driving system comprising a transmission belt passing through the activating bath, the chemical etching bath, the water-washing bath, the slight-etching bath, and the end-washing bath, the transmission belt being configured for carrying the printed circuit board, a material of the transmission belt being polytetrafluoroethylene-containing material.

2. The film hole forming apparatus as claimed in claim 1, wherein the polytetrafluoroethylene-containing material is a mixture of polytetrafluoroethylene and glass fiber.

3. The film hole forming apparatus as claimed in claim 1, wherein the polytetrafluoroethylene-containing material is a mixture of polytetrafluoroethylene and polymer.

4. The film hole forming apparatus as claimed in claim 1, wherein the chemical etching system further comprises a pre-washing bath after the chemical etching bath and an acid-washing bath between the pre-washing bath and the water-washing bath, the pre-washing bath being configured for washing the printed circuit board coming from the chemical etching bath, and the acid-washing bath being configured for neutralizing a chemical etching solution of the chemical etching bath remaining on the printed circuit board.

* * * * *